United States Patent [19]

Cho

[11] Patent Number: 5,574,456
[45] Date of Patent: Nov. 12, 1996

[54] SIGNAL PROCESSING METHOD AND APPARATUS THEREFOR

[75] Inventor: Gea-ok Cho, Suwon, Rep. of Korea

[73] Assignee: Samsung Electronics Co., Ltd., Kyungki-do, Rep. of Korea

[21] Appl. No.: 280,826

[22] Filed: Jul. 26, 1994

[30] Foreign Application Priority Data

Jul. 26, 1993 [KR] Rep. of Korea .................. 93-14196

[51] Int. Cl.⁶ .................................................. H03M 1/60
[52] U.S. Cl. ....................................... 341/157; 341/110
[58] Field of Search ..................................... 341/110, 152, 341/157

[56] References Cited

U.S. PATENT DOCUMENTS

| | | | |
|---|---|---|---|
| 4,219,879 | 8/1980 | Judell | 364/602 |
| 4,509,037 | 4/1985 | Harris | 341/143 |
| 4,608,553 | 8/1986 | Ormond | 341/166 |
| 4,910,515 | 3/1990 | Iwamatsu | 341/110 |
| 4,965,867 | 10/1990 | Tsuchida et al. | 341/118 |
| 5,276,764 | 1/1994 | Dent | 395/2 |

*Primary Examiner*—Marc S. Hoff
*Attorney, Agent, or Firm*—Sughrue, Mion, Zinn, Macpeak & Seas

[57] ABSTRACT

A signal processing method includes steps for converting an input analog signal into a pulse width modulated signal, for converting the pulse width modulated signal into a single-bit digital signal, for digitally processing the converted single-bit digital signal into a processed digital signal and for converting the processed digital signal into an output analog signal. The signal processing method advantageously reduces the required memory capacity of the digital signal processor and permits a simplified circuit configuration to be adopted. Several corresponding apparatuses are also described.

20 Claims, 5 Drawing Sheets

5,574,456

SIGNAL PROCESSING METHOD AND APPARATUS THEREFOR

BACKGROUND OF THE INVENTION

1. Field of the Invention

The present invention relates to a signal processing method and, more particularly, to a signal processing method whereby an analog signal is converted into a digital signal, the converted signal is processed and the processed signal is restored into an analog signal. Advantageously, the analog-to-digital conversion can be performed by converting the analog signal to an intermediate signal, in an exemplary case, a pulse-width-modulated (PWM) signal, and digitizing the PWM signal. An apparatus particularly adapted to carry out the signal processing method is also disclosed.

Korean Patent Application No. 93-14196 is incorporated herein by reference for all purposes.

2. Description of Related Art

In digital audio/video systems, since digitized signals are more resistant to noise during recording or transmitting, an analog audio/video signal is converted into a digital signal and then processed, e.g., recorded as digital information onto a recording medium or transmitted via a transmission path. Thereafter, the recorded digital information is read out from the recording medium and reproduced as an analog signal, or the received digital signal is restored to the original analog signal, respectively.

Such systems include both an analog-to-digital (A/D) converter for converting an analog signal into a digital signal and a digital-to-analog (D/A) converter for converting the digital signal into an analog signal. It will be noted that, when the analog signal is digitized, it is sampled at a predetermined rate and, customarily, each sampling signal is converted into a digital signal represented by four, eight, sixteen or thirty-two bits.

According to the conventional method of processing an analog audio or video signal, since the A/D converter, which handles a large number of bits for high-resolution output, is used, the configuration of the A/D converter is complex. Moreover, since the amount of digitized information is cumbersome, the memory size required in implementing digital processing becomes overly large.

U.S. Pat. No. 4,509,037 discloses a delta modulation encoder including means for generating an analog dither signal from an analog image signal, a spectrum tilter for generating a flattened signal from the analog dither signal, a single-bit analog-to-digital converter for generating a digital output from the flattened signal, and means for sampling and providing a digital output and then converting the sampled output into an internal analog signal to be fed back to the dither signal generator. It will be noted that this apparatus tilts the analog dither signal, performs one-bit digitization in response to the phase of the tilted analog dither signal, and samples the digital signal.

SUMMARY OF THE INVENTION

The principal object of the present invention is to provide a simplified method of processing a digitized signal.

Another object of the present invention is to provide an apparatus for processing a signal whose circuit configuration is simplified. These and other objects, features and advantages according to the present invention are provided by a method of processing a signal. The method advantageously includes steps for:

(a) pulse-width-modulating an analog signal;

(b) converting the pulse-width-modulated signal into a single-bit digital signal;

(c) digital-signal-processing the converted single-bit digital signal; and (d) converting the processed single-bit digital signal into an analog signal.

These and other objects, features and advantages according to the present invention are provided by a signal processing apparatus. Advantageously, the signal processing apparatus includes:

pulse-width-modulating means receiving an input analog signal for generating a pulse-width-modulation signal;

single-bit analog-to-digital converting means receiving the pulse-width-modulation signal, for performing wave-shaping thereon, for sampling the result responsive to a clock signal having a predetermined frequency to thereby generate a serially grouped single-bit digital signal;

digital-signal-processing means receiving the serially grouped single-bit digital signal for digital-signal-processing the same to thereby output a processed serially grouped single-bit digital signal; and output means for low-pass-filtering the processed serially grouped single-bit digital signal to thereby provide a filtered signal, for integrating the filtered signal to thereby generate an integrated signal and for low-pass-filtering the integrated signal to thereby form an output analog signal.

BRIEF DESCRIPTION OF THE DRAWINGS

The above objects and advantages of the present invention will become more apparent by describing in detail a preferred embodiment thereof with reference to the attached drawings in which like elements are denoted by like or similar numbers and in which.

DETAILED DESCRIPTION OF THE PREFERRED EMBODIMENTS

Figure 1:
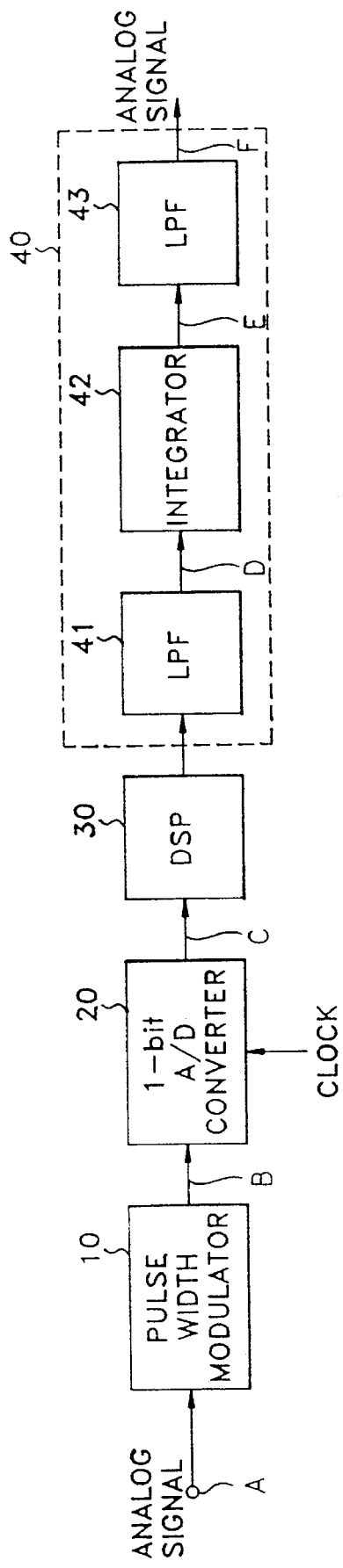
FIG. 1 is a high-level block diagram of the signal processor according to a preferred embodiment of the present invention.

Before describing the signal processing apparatus according to the present invention, the signal processing method according to the preferred embodiments of the present invention will first be described. As a first step, an analog signal is pulse-width-modulated and wave-shaped to form a square wave signal. Thereafter, the square wave signal is sampled at the rate of a clock signal having a predetermined frequency, to then form a data stream as a series of logic "0's" during the low intervals of the pulse-width-modulated signal and a series of logic "1's" during the high periods thereof, thereby generating a single-bit digital signal composed of consecutive groups of logic "0" and logic "1" series. These consecutive groups of logic "0" and logic "1" will hereinafter be referred to as a serially grouped single-bit digital signal. It will be appreciated that a single-bit digital signal is obtained in one sampling period according to the present invention, which is completely different from conventional digital signal expressed in multiple-bit form.

According to the present invention, the signal resolution advantageously can be determined by the frequency of the sampling clock. That is to say, a higher clock frequency improves resolution while a lower clock frequency results in poorer resolution. It will also be appreciated that the data amount according to the present invention is reduced to 1/n compared to that produced by the conventional method of n-bit analog-to-digital conversion. This is because A/D conversion according to the present invention produces only a single-bit digital signal for each sampling of the analog waveform. Advantageously, the single-bit digital signal enables a reduction in memory capacity used in digital signal processing.

Moreover, since a serially grouped single-bit digital signal retains certain analog signal characteristics, a separate digital-to-analog converter preferably is not necessary since the digital signals advantageously can be restored to analog form rather simply, e.g., by low-pass-filtering. It will be appreciated that this signal attribute can substantially simplify the overall circuit configuration. That is to say, the basic concept of the signal processing method according to the present invention is that the characteristics of the input analog signal are retained in the pulse-width-modulation signal as pulse-width-variant information. In addition, the pulse-widths can then be converted into a run-length (logic "0's" or logic "1's") data stream, thereby permitting the use of a digital conversion technique which is actually performed by single-bit analog-to-digital conversion.

According to another aspect of the invention, another method for forming a pulse-width-modulation signal can be used whereby the frequency of an analog signal is first modulated and then the frequency modulation signal is limited. It will be appreciated that this method forms a pulse-width-modulation signal whose pulse-width is modulated according to frequency. When this technique is used, there should be a complementary frequency demodulation step for restoring the analog signal. According to another aspect of the present invention, the frequency demodulation step may be omitted by further processing of the signal prior to A/D conversion. Preferably, the limited frequency modulation signal is delayed for a predetermined time and the phase difference between the delayed signal and the limited frequency modulation signal is detected to obtain a double frequency modulation signal. If the doubled frequency modulation signal is then single-bit digitized, the original analog signal may be obtained from the serially grouped single-bit digital signal by merely low-pass-filtering.

With the above discussion in mind, the preferred embodiments of a signal processing apparatus according to the present invention will now be explained with reference to FIG. 1 through FIGS. 7A–7G.

FIG. 1, which is a high-level block diagram of the signal processor according to one preferred embodiment of the present invention, includes a pulse-width modulator 10, a 1-bit A/D converter 20, a digital signal processor (DSP) 30, and output circuit 40 acting as output means. Advantageously, output circuit 40 may include low-pass filters 41 and 43 serially connected to one another via an integrator 42.

Figure 2A:
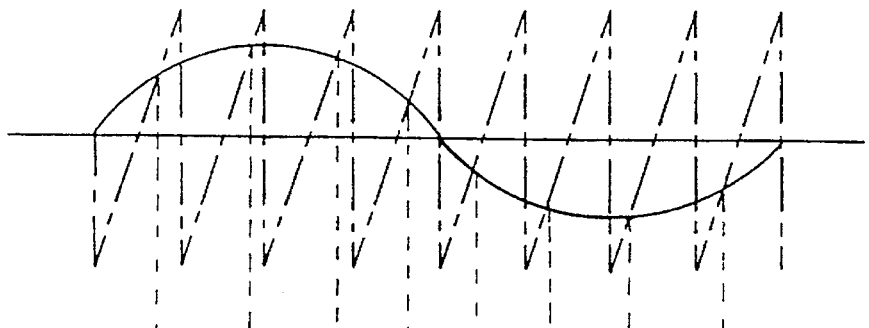
FIG. 2A through FIG. 2F are waveforms which illustrate input and output signal waveforms at various points of the circuit shown in FIG. 1.
Figure 2B:
Figure 2C:

The operation of this embodiment of the present invention will be described with reference to the waveforms shown in FIG. 2A through FIG. 2F. The pulse-width modulator 10 receives an analog signal (FIG. 2A), which is compared therein with an internally generated triangular-wave signal, and outputs a pulse-widthmodulation (PWM) signal (FIG. 2B) as the comparison result. Preferably, the triangular-wave signal has a frequency at least twice that of the maximum frequency component of the input analog signal. Thereafter, the 1-bit A/D converter 20 receives the PWM signal of FIG. 2B, samples the received signal in accordance with a clock signal having a predetermined frequency, and then generates a serially grouped single-bit digital signal (FIG. 2C).

Figure 3:
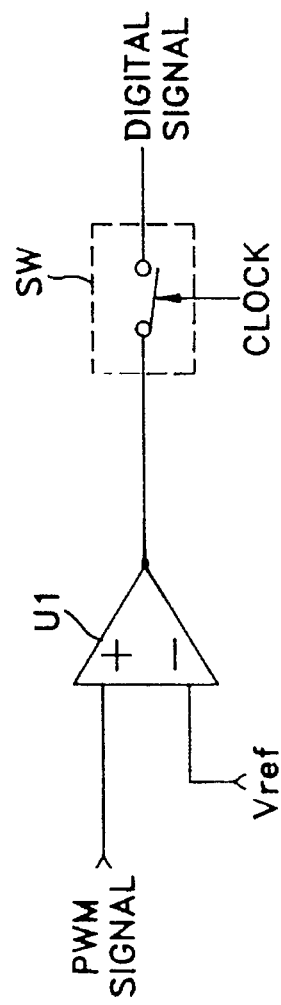
FIG. 3 is an exemplary circuit diagram of the single-bit analog-to-digital converter shown in FIG. 1.

As shown in FIG. 3, which is a circuit diagram of the 1-bit A/D converter 20 shown in FIG. 1, the PWM signal preferably is received at the non-inverting input port of an operation amplifier U1 while a reference signal (Vref) is applied to the inverting input port thereof. Advantageously, the output of opamp U1 can be a square wave signal which is wave-shaped with respect to the reference signal. The wave-shaped square wave signal of opamp U1 is then supplied to a sampling switch SW which is switched in response to an applied clock signal to thereby generate the serially grouped single-bit digital signal.

Referring again to FIG. 1, DSP 30 advantageously may perform data compression, such as a run-length compression method or error-correction coding before recording or transmitting the serially grouped single-bit digital signal. It will of course be appreciated that complementary processing techniques such as data expansion or error-correction decoding will be performed when the processed serially grouped single-bit digital signal is output from DSP 30. In an exemplary case, DSP 30 can be a digital magnetic recording apparatus. In yet another exemplary case, DSP 30 can be a digital communication apparatus.

Figure 2D:
Figure 2E:
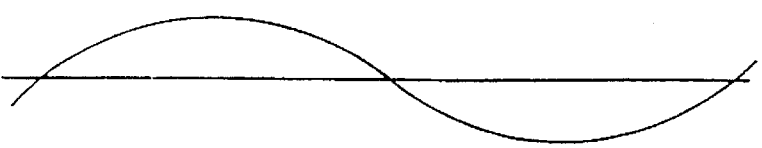
Figure 2F:
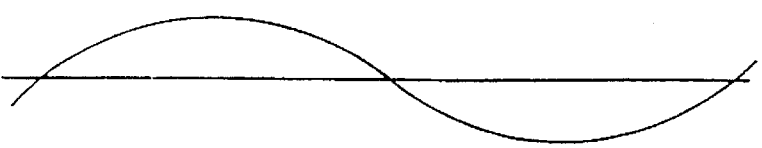

The output circuit 40 receives a serially grouped single-bit digital signal supplied from DSP 30 and performs low-pass-filtering thereon by means of the low-pass filter (LPF) 41, thereby restoring a pulse-width-modulation signal (FIG. 2D). The output of LPF 41, i.e., the restored PWM signal, is then integrated by integrator 42 to thereby obtain an integrated waveform (FIG. 2E). After receiving the integrated waveform, LPF 43 performs an additional low-pass-filtering function to thereby produce an output analog signal (FIG. 2F).

As described above, according to one preferred embodiment of the present invention, the signal processor can be simplified by the use of the 1-bit A/D converter and two low-pass filters. It will be appreciated that the required memory capacity of the digital signal processor can be reduced.

Figure 4:
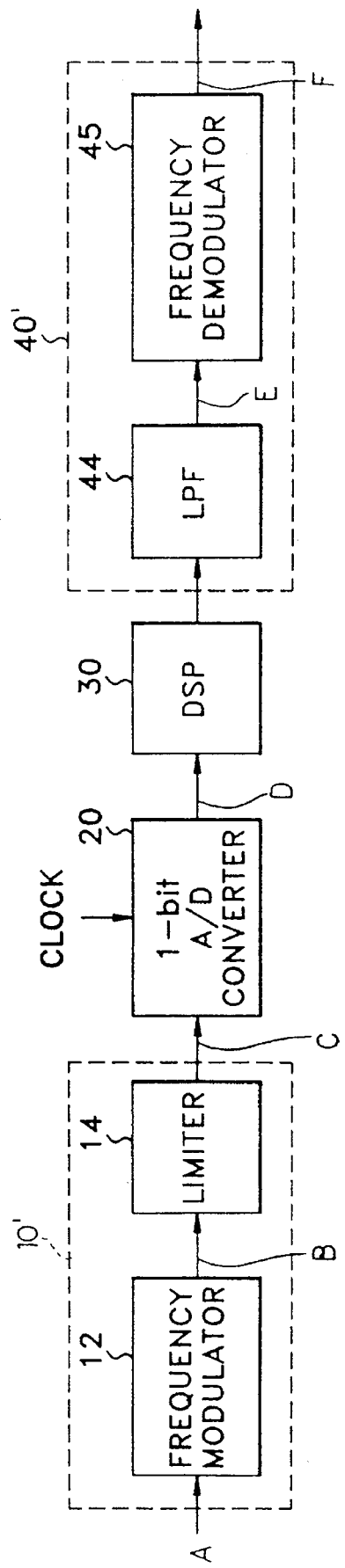
FIG. 4 is a high-level block diagram of the signal processor according to another preferred embodiment of the present invention.

FIG. 4, which is a high-level block diagram of the signal processor according to another preferred embodiment of the present invention, has a configuration similar to that shown in FIG. 1. However, according to FIG. 4, the pulse-width modulator 10' advantageously can include a frequency modulator 12 and a limiter 14, while the output circuit 40' preferably includes a low-pass filter 44 and a frequency demodulator 45.

Figure 5A:
FIG. 5A through FIG. 5F are waveforms which illustrate input and output signal waveforms at various points of the circuit shown in FIG. 4.
Figure 5B:
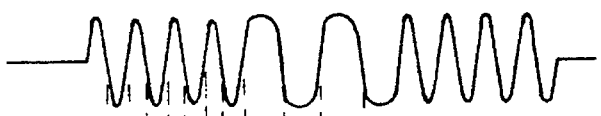
Figure 5C:
Figure 5D:
Figure 5E:

The operation of this embodiment of the present invention will be described with reference to the waveforms shown in FIGS. 5A through 5F. The analog signal of FIG. 5A, which is depicted as a simple square wave for purposes of illustration only, is applied to frequency modulator 12 and output as a frequency modulation signal (FIG. 5B). The frequency modulation signal is output through limiter 14 as a limited signal (FIG. 5C). It will be appreciated that the limited frequency modulation signal output by limiter 14 advantageously will have the form of a PWM signal whose pulse-width is modulated according to frequency.

It will be appreciated that the operation of A/D converter 20 and DSP 30 will be identical to that described with respect to FIG. 1. Therefore, a detailed description of operation of these intermediate components will be omitted in the interest of brevity.

Figure 5F:

The output circuit 40' receives the serially grouped single-bit digital signal (FIG. 5D) from DSP 30, and performs low-pass-filtering via the low-pass filter 44 thereby obtaining a signal (FIG. 5E) whose waveform is the same as the limited frequency modulation signal. The output signal of the low-pass filter 44 is demodulated by frequency demodulator 45 to produce an output analog signal (FIG. 5F).

Figure 6:
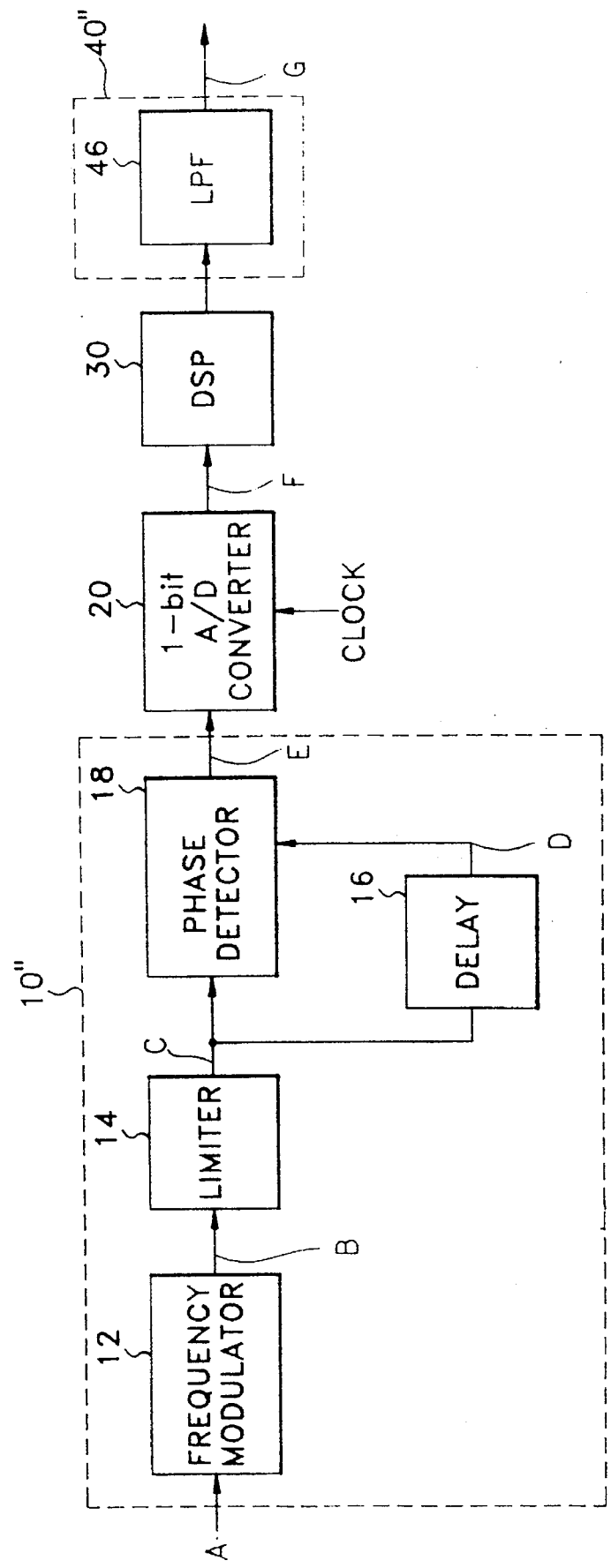
FIG. 6 is a high-level block diagram of the signal processor according to still another preferred embodiment of the present invention.

FIG. 6, which is a high-level block diagram of the signal processor according to yet another preferred embodiment according to present invention, is similar to that shown in FIG. 4. In FIG. 6, however, a delay 16 and a phase detector 18 are further provided between the limiter 14 of pulse-width modulator 10" and the 1-bit A/D converter 20. Additionally, the output circuit 40" according to FIG. 6 consists solely of a low-pass filter 46.

Figure 7A:
FIG. 7A through FIG. 7G are waveforms which useful in explaining the operation of the circuit shown in FIG. 6.
Figure 7B:
Figure 7C:
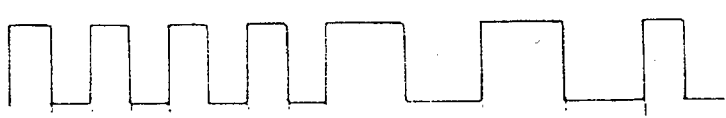
Figure 7D:
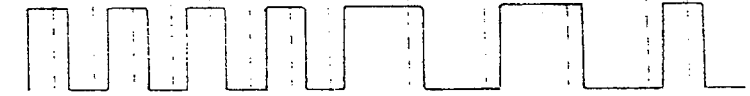
Figure 7E:
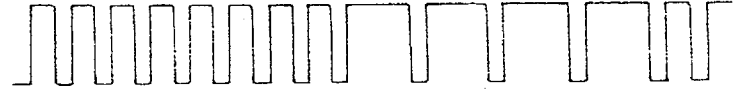

Referring to FIGS. 7A through 7G, the frequency modulator 12 converts an analog signal (FIG. 7A) into a frequency modulation signal (FIG. 7B) which is supplied to the limiter 14. The limited frequency modulation signal (FIG. 7C) is delayed by means of the delay 16 to thereby obtain a delayed signal (FIG. 7D). The phase difference between the delayed and undelayed signals is detected in phase detector 18 to thereby output a double frequency modulation signal (FIG. 7E).

Figure 7F:
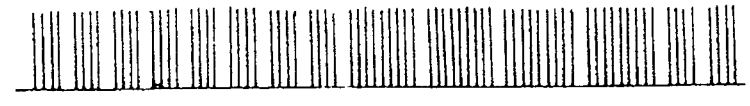
Figure 7G:
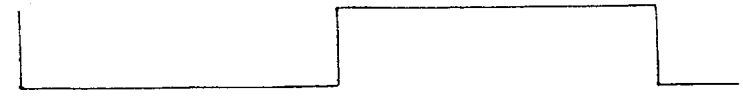

It will be appreciated that the A/D converter 20 receives the double frequency modulation signal to thereby generate a serially grouped single-bit digital signal (FIG. 7F). After processing via DSP 30, the low-pass filter 46 filters the serially grouped single-bit digital signal to thereby output an output analog signal (FIG. 7G) without the need for a frequency demodulation function.

As described above, according to the present invention, the size of the signal processing memory of a signal processor can be reduced by converting an analog signal such as audio or video signal into a digital signal for recording or transmission, and the circuit configuration thereof is simplified.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A signal processing method comprising the steps of:
   (a) forming an input analog signal into a pulse-width-modulation signal;
   (b) converting said pulse-width-modulation signal into a single-bit digital signal;
   (c) digital-signal processing said single-bit digital signal to thereby generate a processed single-bit digital signal; and
   (d) converting said processed single-bit digital signal into an output analog signal.

2. The signal processing method as claimed in claim 1, wherein said step (a) is performed with respect to a triangular-wave reference signal having a predetermined frequency at least double a respective maximum frequency of said input analog signal.

3. The signal processing method as claimed in claim 1, wherein said step (a) comprises the steps of:
   (i) forming said input analog signal into a frequency-modulated signal; and
   (ii) limiting said frequency-modulated signal to thereby provide said pulse-width-modulation signal whose pulse width varies according to frequency of said input analog signal.

4. The signal processing method as claimed in claim 3, wherein said step (a) further comprising the steps of:
   (iii) delaying a limited frequency modulation signal produced during step (a)(ii) for a predetermined time to produce a delayed signal; and
   (iv) detecting a phase difference between said delayed signal and said limited frequency modulation signal.

5. The signal processing method as claimed in claim 4, wherein said step (d) comprises the step of converting said processed single-bit digital signal into said output analog signal by low-pass filtering.

6. The signal processing method as claimed in claim 3, wherein said step (d) comprises the steps of:
   (i) low-pass filtering said processed single-bit digital signal to thereby generate a filtered signal; and
   (ii) frequency demodulating said filtered signal to thereby produce said output analog signal.

7. The signal processing method as claimed in claim 1, wherein said step (b) comprises the steps of:
   (i) comparing said pulse-width-modulation signal with a reference signal to produce a comparison result; and
   (ii) sampling said comparison result responsive to a clock signal having a predetermined frequency to thereby produce said single-bit digital signal.

8. The signal processing method as claimed in claim 1, wherein said step (c) comprises the steps of:
   (i) recording said single-bit digital signal onto a recording medium as a recorded single-bit digital signal; and
   (ii) subsequently recovering said recorded single-bit digital signal to thereby generate said processed single-bit digital signal.

9. The signal processing method as claimed in claim 1, wherein said step (c) further comprises the steps of:
   (i) compressing and encoding said single-bit digital signal to thereby generate a compressed signal;
   (ii) recording said compressed signal onto a recording medium as a recorded signal;
   (iii) reproducing said recorded signal to thereby provide a recovered compressed signal; and
   (iv) decoding and data expanding said recovered compressed signal to thereby generates said processed single-bit digital signal.

10. The signal processing method as claimed in claim 1, wherein said step (a) is performed with respect to a triangular-wave reference signal having a predetermined frequency at least double a respective maximum frequency of said input analog signal and wherein said step (d) comprises the steps of:
    (i) low-pass filtering said processed single-bit digital signal to provide a filtered signal;

(ii) integrating said filtered signal to generate an integrated signal; and (iii) low-pass filtering said integrated signal to thereby generate said output analog signal.

11. A signal process apparatus comprising:

pulse width modulating means receiving an input analog signal for generating a pulse-width-modulation signal;

1-bit analog-to-digital converting means receiving said pulse-width-modulation signal for wave-shaping said pulse-width-modulation signal and for sampling the wave-shaped signal by a clock signal having a predetermined frequency to thereby output a serially grouped single-bit digital signal;

digital-signal processing means receiving said serially grouped single-bit digital signal for processing said serially grouped single-bit digital signal to thereby generate a processed serially grouped single-bit digital signal; and output means receiving said processed serially grouped single-bit digital signal for low-pass-filtering said processed serially grouped single-bit digital signal so as to generate a filtered signal, for integrating the filtered signal to produce an integrated signal and for low-pass-filtering the integrated signal to thereby generate an output analog signal.

12. The signal processing apparatus as claimed in claim 11, wherein said 1-bit analog-to-digital converting means comprises:

means for comparing said pulse-width-modulation signal with a preset reference signal to generate a comparison signal; and means for sampling the comparison signal output from said comparing means in accordance with a clock signal having a predetermined frequency.

13. A signal processing apparatus comprising:

modulating means receiving an input analog signal for generating a frequency modulation signal;

limiting means receiving said frequency modulation signal for generating a limited frequency modulation signal;

1-bit analog-to-digital converting means receiving said limited frequency modulation signal for wave-shaping said limited frequency modulation signal to produce a waved-shaped signal, for sampling the wave-shaped signal responsive to a clock signal having a predetermined frequency, and for generating a serially grouped single-bit digital signal;

digital-signal processing means receiving said serially grouped single-bit digital signal for processing said serially grouped single-bit digital signal to thereby provide a processed serially grouped single-bit digital signal; and output means receiving said processed serially grouped single-bit digital signal for low-pass-filtering said processed serially grouped single-bit digital signal to provide a filtered signal and for frequency-demodulating the filtered signal so as to output an output analog signal.

14. The signal processing apparatus as claimed in claim 13, wherein said single-bit analog-to-digital converting means comprises:

means for comparing said limited frequency demodulation signal with a preset reference signal to produce a pulse signal; and means for sampling said pulse signal output from said comparing means in accordance with a clock signal having a predetermined frequency.

15. A signal processing apparatus comprising:

modulating means receiving an input analog signal for providing a frequency modulation signal;

limiting means receiving said frequency modulation signal for generating a limited frequency modulation signal;

phase detecting means for delaying said limited frequency modulation signal for a predetermined time to produce a delayed signal, for comparing the phases of the delayed signal and said limited frequency modulation signal to thereby output a doubled frequency modulation signal;

1-bit analog-to-digital converting means receiving said doubled frequency modulation signal for wave-shaping said doubled frequency modulation signal to generate a wave-shaped signal, for sampling the wave-shaped signal by a clock signal having a predetermined frequency to thereby generate a serially grouped single-bit digital signal;

digital-signal processing means receiving said serially grouped single-bit digital signal for digitally processing said serially grouped single-bit digital signal to thereby output a processed serially grouped single-bit digital signal; and output means receiving said processed serially grouped single-bit digital signal for low-pass-filtering said processed serially grouped single-bit digital signal to thereby output an output analog signal.

16. The signal processing apparatus as claimed in claim 15, wherein said 1-bit analog-to-digital converting means comprises:

means for comparing said limited frequency modulation signal with a preset reference signal so as to generate a pulse signal; and means for sampling the pulse signal output from said comparing means in accordance with a clock signal having a predetermined frequency.

17. A signal processing apparatus including a digital signal processor receiving a serially grouped single-bit digital signal generating a processed serially grouped single-bit digital signal, said apparatus comprising:

generating means receiving an input analog signal for generating a modulated signal having a first signal level and a second signal level representing said input analog signal;

1-bit analog-to-digital converting means receiving said modulated signal for wave-shaping said modulated signal to provide a wave-shaped signal, for sampling the wave-shaped signal responsive to a clock signal having a predetermined frequency, and for generating the serially grouped single-bit digital signal; and filter means receiving said processed serially grouped single-bit digital signal for low-pass-filtering said processed serially grouped single-bit digital signal so as to permit generation of an output analog signal corresponding to said input analog signal.

18. The signal processing apparatus as claimed in claim 17, wherein said generating means comprises pulse width modulating means receiving an input analog signal for generating said modulated signal, and wherein said filter means comprises:

first means receiving said processed serially grouped single-bit digital signal for low-pass-filtering said processed serially grouped single-bit digital signal so as to generate a filtered signal;

second means for integrating the filtered signal to produce an integrated signal; and third means for low-pass-filtering the integrated signal to thereby generate said output analog signal.

19. The signal processing apparatus as claimed in claim 17, wherein said generating means comprises:

modulating means receiving said input analog signal for providing a frequency modulation signal;

limiting means receiving said frequency modulation signal for generating a limited frequency modulation signal as said modulated signal; and wherein said filter means comprises:

first means receiving said processed serially grouped single-bit digital signal for low-pass-filtering said processed serially grouped single-bit digital signal to provide a filtered signal; and second means for frequency-demodulating the filtered signal so as to output said output analog signal.

20. The signal processing apparatus as claimed in claim 17, wherein said generating means comprises:

modulating means receiving said input analog signal for providing a frequency modulation signal;

limiting means receiving said frequency modulation signal for generating a limited frequency modulation signal; and phase detecting means for delaying said limited frequency modulation signal for a predetermined time to produce a delayed signal, for comparing the phases of the delayed signal and said limited frequency modulation signal to thereby output said modulated signal.

* * * * *